United States Patent [19]
Rose, Jr. et al.

[11] Patent Number: 5,935,065
[45] Date of Patent: Aug. 10, 1999

[54] MRI SYSTEM WITH PERIPHERAL ACCESS AND INHOMOGENEOUS FIELD

[75] Inventors: Freeman H. Rose, Jr., Del Mar; Wayne Cornelius; Christopher W. Crowley, both of San Diego, all of Calif.

[73] Assignee: Panacea Medical Laboratories, Carlsbad, Calif.

[21] Appl. No.: 08/884,415

[22] Filed: Jun. 27, 1997

[51] Int. Cl.⁶ ................................... A61B 5/055
[52] U.S. Cl. ................... 600/421; 324/318; 335/296
[58] Field of Search ................. 600/410, 415, 600/421, 422; 324/318, 319, 321; 335/296, 302, 306

[56] References Cited

U.S. PATENT DOCUMENTS

| | | |
|---|---|---|
| 4,296,378 | 10/1981 | King . |
| 4,379,262 | 4/1983 | Young . |
| 4,542,343 | 9/1985 | Brown . |
| 4,656,425 | 4/1987 | Bendel . |
| 4,684,891 | 8/1987 | Feinberg . |
| 4,721,914 | 1/1988 | Fukushima et al. . |
| 4,733,190 | 3/1988 | Dembinski . |
| 4,875,485 | 10/1989 | Matsutani . |
| 4,985,678 | 1/1991 | Gangarosa et al. . |
| 4,998,976 | 3/1991 | Rapoport . |
| 5,057,777 | 10/1991 | Kurczwski . |
| 5,111,146 | 5/1992 | Kuhn . |
| 5,117,188 | 5/1992 | Ohkawa . |
| 5,153,517 | 10/1992 | Oppelt et al. . |
| 5,207,224 | 5/1993 | Dickinson et al. . |
| 5,304,930 | 4/1994 | Crowley et al. . |
| 5,361,764 | 11/1994 | Reynolds et al. . |
| 5,390,673 | 2/1995 | Kikinis . |
| 5,402,094 | 3/1995 | Enge . |
| 5,462,054 | 10/1995 | Rapoport et al. . |
| 5,473,251 | 12/1995 | Mori . |
| 5,481,192 | 1/1996 | Mehlkopf et al. . |
| 5,495,222 | 2/1996 | Abele et al. . |
| 5,500,596 | 3/1996 | Grist et al. . |
| 5,502,387 | 3/1996 | McGill . |
| 5,565,834 | 10/1996 | Hanley et al. . |
| 5,675,305 | 10/1997 | DeMeester et al. . |

*Primary Examiner*—William E. Kamm
*Assistant Examiner*—Shawna J. Shaw
*Attorney, Agent, or Firm*—Nydegger & Associates

[57] ABSTRACT

An MRI apparatus for imaging an object includes a base, a pair of magnets, and a transceiver unit. The magnets are mounted on the base with the North pole face of one magnet facing the South pole face of the other magnet. The North pole face and the South pole face are each substantially arcuate, and are positioned on the base to establish a magnetic field in a substantially U-shaped region between the North pole face and the South pole face. Importantly, imaging is performed in a nonhomogeneous portion of this magnetic field. This portion is characterized by substantially parallel surfaces having mutually different constant magnetic field magnitudes. Importantly, the space between the magnets at the top of the U-shaped region creates an access into the U-shaped region. To image an object, the object is placed through the access and into the portion of the magnetic field having surfaces of constant magnetic field magnitude. The transceiver unit is then used to selectively irradiate each surface in the magnetic field with electromagnetic radiation to image the object over each surface.

24 Claims, 1 Drawing Sheet

Fig. 1
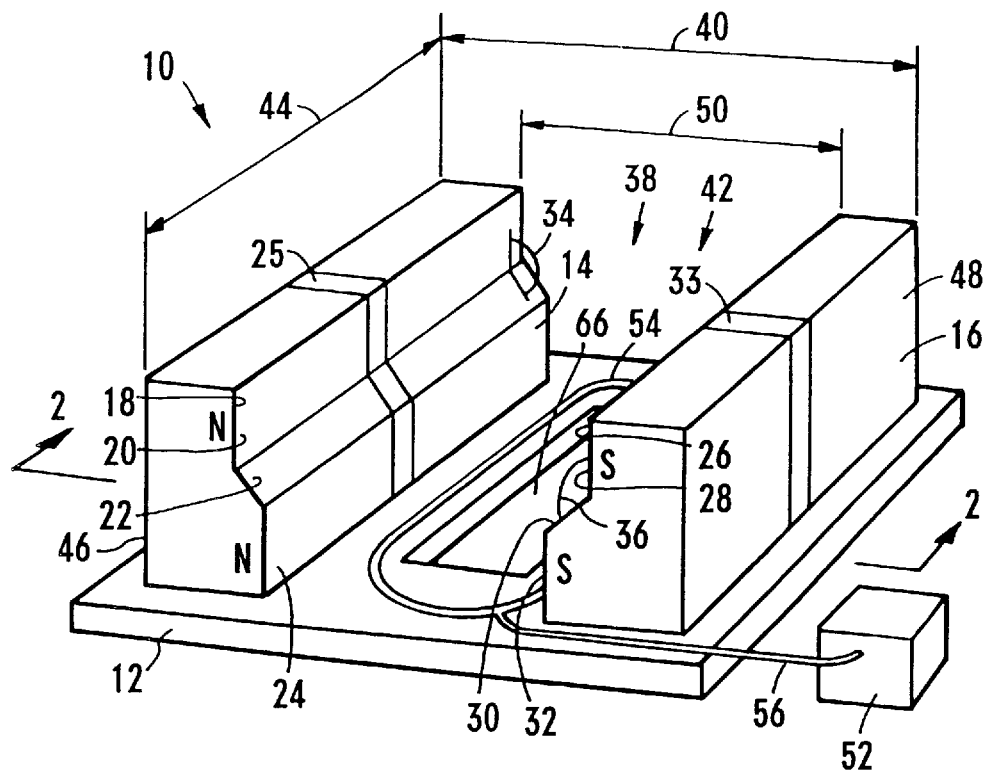
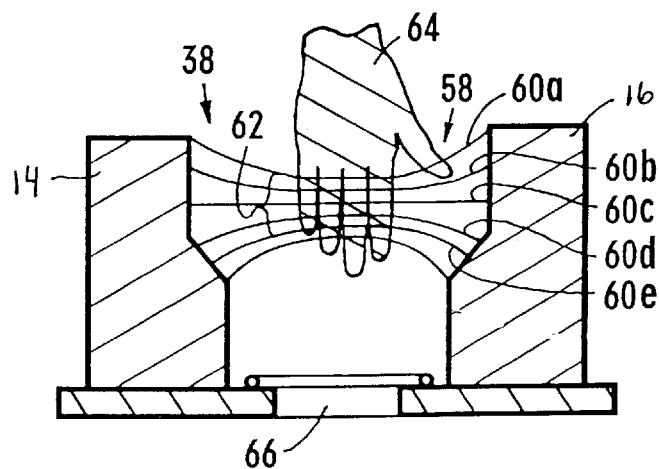
Fig. 2
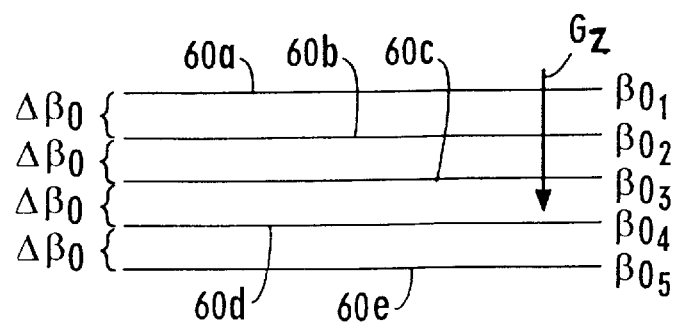
Fig. 3

MRI SYSTEM WITH PERIPHERAL ACCESS AND INHOMOGENEOUS FIELD

FIELD OF THE INVENTION

The present invention pertains generally to Magnetic Resonance Imaging (MRI) systems. More specifically, the present invention pertains to small MRI systems which use non-homogeneous magnetic fields for imaging biological tissue. The present invention is particularly, but not exclusively, useful as an MRI system which has a high degree of peripheral accessibility and which uses a non-homogeneous magnetic field having surfaces of mutually different magnetic field magnitudes and a magnetic field gradient, for producing images of an object.

BACKGROUND OF THE INVENTION

It is widely known that magnetic resonance imaging (MRI) is capable of yielding useable information about the composition of internal biological tissues. One very important and widely used application of MRI is for noninvasive clinical imaging of internal portions of the human body. As is well known, MRI relies on the nuclear magnetic resonance of nuclei to produce maps or images of those internal portions of the human body. Importantly, MRI is a non-invasive procedure which can be safely and efficaciously used to acquire medical information about specific internal tissues.

It is known that certain atomic nuclei have nuclear magnetic moments which, when placed in a static magnetic field can only take up certain discrete orientations. Each of these orientations corresponds to a different energy state for the nucleus. Further, it is known that the application of radio frequency (RF) electromagnetic radiation, also referred to as electromagnetic waves, to nuclei in a magnetic field can induce a transition in the energy state of nuclei from one level to another. Such a transition is known as nuclear magnetic resonance (NMR).

A particular frequency of RF electromagnetic waves, known as the Larmor frequency, is the most effective frequency for inducing a change in the energy state and the corresponding orientation of the magnetic moment of a particular nucleus in a magnetic field. Specifically, the Larmor frequency for each nucleus is proportional to the magnitude of the magnetic field at the location of the particular nucleus. To image nuclei, electromagnetic waves at the Larmor frequency for the nuclei to be imaged are transmitted by an antenna that is connected to a transmitter. The electromagnetic waves transmitted at the Larmor frequencies induce changes in the orientations of the magnetic moments of the nuclei to be imaged. Subsequently, as the magnetic moments of the nuclei return to their initial orientations, the magnetic moments of the nuclei generate detectable electromagnetic waves, which can be refocused to form spin echoes. The characteristics of these spin echoes are representative of the local environment of the nuclei being imaged. The spin echoes generated by the nuclei are detected by an RF receiver. Importantly, the detected electromagnetic waves oscillate at the local Larmor frequency. From the foregoing discussion, it is appreciated that nuclei placed within a range of magnetic fields will oscillate within a corresponding range of Larmor frequencies.

Most MRI devices utilize a static magnetic field that is homogeneous. In a homogeneous magnetic field, the components of the gradient of the magnitude of the magnetic field are all substantially equal to zero, ($G_X=G_Y=G_Z=0$) at all points within the imaging region of the field. Hence the oscillating RF bandwidth is relatively narrow. In contrast, in a nonhomogeneous magnetic field at least one of the components of a gradient, $G_Z$, is not equal to zero. U.S. Pat. No. 4,498,048, which issued to Lee et al., for a device entitled "NMR Imaging Apparatus" is an example of an MRI device which has a substantially homogeneous magnetic field. In contrast, U.S. Pat. No. 5,304,930 (hereinafter the '930 patent), which issued to Crowley et al., for a device entitled "Remotely Positioned MRI System" is an example of an MRI device which has a non-homogeneous static magnetic field. Importantly, the '930 patent also discloses methods for producing images with an MRI device having a substantially non-zero magnetic field gradient.

For both MRI devices that have a homogeneous magnetic field and MRI devices that have a non-homogeneous magnetic field, it is important to shape and position the magnets to provide adequate access to the magnetic field for the patient. Providing for comfortable placement of the patient while providing adequate access to the magnetic field region is important to producing high quality medical images. Large magnets with their corresponding support structure can hinder patient access to the magnetic field of an MRI device. For MRI devices that have a homogeneous magnetic field, the physical dimensions of the magnet are substantially larger than the imaging volume needed to make medically useful images of internal portions of a human body. Due to the bulk of the magnets in MRI devices that have a homogeneous magnetic field, the size of the opening for patient access to the magnetic field in these devices is generally restricted in size. This limited access results from the fact that producing a high degree of field homogeneity requires a careful juxtaposition of magnetic field sources. By design, the juxtaposition of these sources is such that the field of these gradients mutually cancel to a high degree of precision to give the result $G_x=G_y=G_z=0$. Magnetic sources must often be placed throughout the periphery of the imaging volume in order to achieve such mutual cancellation, thereby restricting peripheral access. In contrast MRI devices that have a nonhomogeneous magnetic field do not require complete cancellation of the static field gradients. As a result, some peripheral portion of the magnet may be left open, thereby providing less restrictive patient access. In addition to providing patient access, a non-uniform field magnet is easier to construct, and is less sensitive to variations in temperature and engineering tolerances.

The magnet system disclosed in the '930 patent is an example representative of this general trend towards less restrictive access magnets. In particular, a magnet having a non-uniform magnetic field neither surrounds nor confines the tissue being imaged. Instead, the magnet is juxtaposed against the tissue to be imaged. The present invention recognizes that there are compelling reasons to use magnets that may be somewhat more confining than a remotely positioned magnet while still retaining the benefits of peripheral access in a nonhomogeneous magnetic field. In particular, the present invention recognizes that some juxtaposition of magnet sources may be used to reduce the relative magnitude of the aforementioned non-zero field gradient while still providing substantial access to the imaging region within the magnet. As such, the structure of the present invention can be conceptually considered to be between an open, remotely positioned magnet and a closed homogeneous field magnet.

There are several benefits to this approach and they all derive from the relationship between the range of magnetic field values in the static field gradient. In particular, if the nonhomogeneous field gradient is reduced, then the corresponding range of Larmor frequencies is reduced over the specified image volume. From the standpoint of the RF transmittal cited previously, this typically reduces the peak power requirements by reducing the required bandwidth. Reducing RF transmitter power reduces undesirable RF exposure to the patient, energy consumption of the electronic circuitry, and the complexity and size of the transmitter and corresponding power supplies. From the standpoint of the RF receiver, the correspondingly reduced bandwidth for received signals is accompanied by a reduced bandwidth of thermal noise and the signal-to-noise ratio (SNR) is correspondingly increased.

As recognized by the present invention, an increased SNR, and a decrease in the amount of RF transmitter power required to transmit RF waves at Larmor frequencies can be realized by properly shaping the static magnetic field. The magnetic field is shaped by juxtapositioning magnetic field sources to reduce the magnitude of the magnetic field gradient $G_z$ without attempting to completely cancel that gradient. Reducing the magnitude of the magnetic field gradient, $G_z$, decreases the range of the magnitude of the magnetic field over a fixed imaging volume, thereby reducing the bandwidth of the Larmor frequencies required to image that volume. The reduced bandwidth of Larmor frequencies permits reducing the bandwidth of the RF receiver, which results in reception of less noise power by the receiver and a corresponding increase in the SNR. Reducing the bandwidth of the Larmor frequencies also permits reducing the bandwidth of the RF transmitter, which correspondingly reduces transmitter power.

In light of the above, it is an object of the present invention to provide an MRI apparatus for imaging an object, with open access to the magnetic field. It is another object of the present invention to provide an MRI apparatus with a small but substantially non-zero gradient of the magnetic field magnitude to produce a relatively larger SNR and to realize relatively smaller RF transmitter power. Yet another object of the present invention is to provide an MRI apparatus for imaging an object which is easy to implement, simple to use, portable, and comparatively cost effective.

SUMMARY OF THE INVENTION

An MRI apparatus for imaging an object includes, a plurality of magnet sources, a transceiver unit and a base which acts as a support structure. The magnets are mounted on the base with the North pole face of one magnet facing the South pole face of the other magnet. The North pole face and the South pole face are each substantially arcuate, to establish a magnetic field in a U-shaped channel region between the North pole face and the South pole face. Due to the detailed configuration of the magnets, a portion of the magnetic field volume is characterized by substantially parallel, nearly planar surfaces having mutually different constant magnetic field magnitudes. In an alternative embodiment, these surfaces may be non-planar contours that are generally saddle shaped. This portion of the magnetic field is further characterized by a non-zero gradient of magnetic field strength. Hence, high precision placement of magnet sources around the imaging volume is not required to reduce the gradient substantially to zero. As a result, the magnet design does not completely limit peripheral access to the imaging volume. However, the long dimensions and opposing nature of the North pole face and the South pole face serve to reduce the magnitude of the magnetic field gradient. To produce an image, the object is placed in this portion of the magnetic field and the transceiver unit is activated to selectively irradiate each image surface within the magnetic field volume with the appropriate Larmor frequency.

In detail, the North pole face and the South pole face of the magnets each include an upright area which is oriented substantially perpendicular to the base. Each pole face also includes an inclined area which is located between the upright area and the base. Each inclined area is slanted downward from its respective upright area at an obtuse angle. Specifically, the inclined areas are slanted toward each other and toward the base to establish the U-shaped region mentioned above. Small gaps or protrusions in the pole faces can be used to provide local shaping of the magnetic field. This combination of source geometries establishes a nonhomogeneous magnetic field within the U-shaped region that is characterized by planar surfaces with mutually different constant field magnitudes and low magnetic field gradient in one dimension. Further, the upright surfaces of the magnets are distanced from each other to establish an open access into the U-shaped channel region. Accordingly, an object to be imaged can be inserted into the U-shaped region through the top or one end of the U-shaped region.

As implied above, to image the object, the object is placed through the access and into the U-shaped region of the apparatus. Specifically, the object to be imaged is positioned in the portion of the magnetic field that is characterized by planar surfaces having mutually different constant magnetic field magnitudes. Once the object is properly positioned in the magnetic field, the transceiver is used to selectively irradiate the object at each surface of constant magnetic field magnitude with electromagnetic waves of the appropriate Larmor frequency. This causes the atoms in the object to radiate identifiable radio frequency spin echo signals which are received by the antenna and the transceiver and used to produce the image. In an alternative embodiment, the bottom of the U-shaped region may be left open in order to allow through passage of the object to be imaged. In that case, the base is understood to provide adequate support while allowing through passage.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts and in which:

FIG. 1 is a perspective view of the MRI apparatus of the present invention;

FIG. 2 is a cross sectional view of the MRI apparatus of FIG. 1 as viewed along line 2—2 in FIG. 1, with an object shown positioned in the magnetic field of the apparatus; and FIG. 3 is an enlarged depiction of the substantially parallel planar surfaces in the magnetic field of the apparatus shown in FIG. 2.

DESCRIPTION OF THE PREFERRED EMBODIMENT

Referring initially to FIG. 1, an MRI apparatus for imaging an object in accordance with the present invention is shown and is generally designated 10. The MRI apparatus 10 includes a base 12, and a first magnet 14, and a second magnet 16, which are mounted on the base 12.

First magnet 14 has a North pole face 18 which includes an upright area 20, an inclined area 22, and an elevated area 24. First magnet 14 also has a gap 25 located approximately half way along its length. Similarly, second magnet 16 has a South pole face 26 which includes an upright area 28, an inclined area 30, and an elevating area 32. Second magnet 16 also has a gap 33 located approximately half way along its length. Upright area 20 and upright area 28 are substantially planar, and are both oriented substantially perpendicular to the base 12. Additionally, elevating area 24 and elevating area 32 are both oriented substantially perpendicular to the base 12. Inclined area 22 is located between upright area 20 and elevating area 24, and slants from the upright area 20 towards the base 12 at an obtuse angle 34 of about one hundred thirty-five degrees (135°). Similarly, inclined area 30 is located between upright area 28 and elevating area 32, and slants from the upright area 28 towards the base 12 at an obtuse angle 36 of about one hundred thirty-five degrees (135°). It will be appreciated by the skilled artisan that the obtuse angles 34, 36 may have values between ninety degrees (90°) and one hundred eighty degrees (180°) other than one hundred thirty five degrees (135°). It will be further appreciated by the skilled artisan that other features of the magnetic field may be adjusted by adjusting the parallelism of upright areas 20 and 28 and elevating areas 24 and 32. Field shaping is also established by adjusting the width of gaps 25 and 33.

As shown in FIG. 1, the North pole face 18 and the South pole face 26 each have a generally arcuate shape. Due to the orientation of the North pole face 18 relative to the South pole face 26 and the arcuate shape of the North pole face 18 and the South pole face 26, a substantially U-shaped region 38 is established between the North pole face 18 and the South pole face 26. Alternately, the U-shaped 38 region may be made to even more closely approximate a U-shape, by forming each inclined area 22, 30 in the shape of an arc.

Upright area 20 and upright area 28 are separated by a distance 50, which is about seven inches (7 inches), to establish an access opening 42 into the U-shaped region 38. Additionally, first magnet 14 and second magnet 16 each have a length of a distance 44 of about thirteen inches (13 inches). Further, a back 46 of the first magnet 14 and a back 48 of the second magnet 16 are separated by a distance 40 of about thirteen inches (13 inches). The skilled artisan will appreciate that the distances 40, 44, 50 can be substantially larger or smaller, and that in general the size of the magnets 14, 16 can be made substantially larger or smaller. The magnets 14, 16 can be permanent magnets, electromagnets, or superconductor magnets.

Still referring to FIG. 1, a transceiver 52 is shown connected to an antenna 54 with an electrical cable 56. The antenna 54 is located on the base 12 between the elevating areas 24, 32. However, the antenna 54 may be located in any convenient location. The transceiver 52 and antenna 54 are used for transmitting and receiving radio frequency waves, which is discussed in detail below. Those skilled in the art will appreciate that a transmitter (not shown) and a receiver (not shown) which are mutually discrete may be used rather than transceiver 52 if desired.

Referring to FIG. 2, a cross-section of the magnetic field 58 produced by magnets 14, 16 in the U-shaped region 38 is shown. The magnetic field 58 produces surfaces 60*a–e* having a gradient of mutually different constant magnetic field magnitudes $B_0$. Due to the juxtaposition of the North pole face and South pole face, the transverse gradients from either face alone are canceled and the vertical gradient is partially canceled. Due to the arcuate shape and orientation of the North pole face 18 and the South pole face 26, the magnetic field gradient is non-zero and the surfaces 60*a–e* are substantially parallel-and planar in a portion 62 of the magnetic field 58. Those skilled in the art will appreciate that the surfaces 60*a–e* shown in FIG. 2 are representative and that the actual number of useable surfaces in portion 62 of the magnetic field 58 may be much greater.

The shape and orientation of the North pole face 18 and the South pole face 26 also produces a magnetic field magnitude that is larger than that due to the north pole face or the south pole face alone. The nominal median value of the magnetic field magnitude $B_0$ of the surfaces 60*a–e* is about two thousand Gauss (2,000 Gauss), although substantially greater or lesser median values can also be implemented.

To produce an image of an object, the object, which in this case is a hand 64 of a patient (not shown), is placed through the access opening 42 and into the portion 62 of the magnetic field 58. The access opening 42 is shaped and sized to allow easy access to portion 62 of the magnetic field 58. Base 12 may have an opening 66 allowing through passage of the object.

Referring to FIG. 3, a cross section of the substantially parallel and planar portions of the surfaces 60*a–e* is shown. The magnitude of the magnetic field in each of the surfaces 60*a–e* is respectively designated $B_{0,1-5}$. In the preferred embodiment, the surfaces 60*a–e* are approximately equidistant, and the change in the magnetic field magnitude between each of the surfaces 60*a–e* is approximately equal to a constant, designated $\Delta B_0$. Consequently, the gradient $G_z$ of the magnitude of the magnetic field in the z direction is constant, and is equal to $\Delta B/B_0$.

Typically, the gradient $G_z$ has a value between about two Gauss per millimeter (2 Gauss/millimeter) and about four Gauss per millimeter (4 Gauss/millimeter), although it will be appreciated by the skilled artisan that the MRI apparatus 10 can be implemented with other values for $G_z$. It is further appreciated that an alternative embodiment may use a non-constant gradient, $\Delta B/B_0$.

The relative value of the gradient $G_z$ produced by the configuration of the magnets 14, 16 is smaller than the gradient present in either magnet taken by itself. This results in a relatively narrower range of values for $B_{0,1-5}$ in the surfaces 60*a–e*. Due to the dependency of the Larmor frequencies upon the values of $B_{0,1-5}$, the narrower range of values of $B_{0,1-5}$ results in a relatively narrower frequency range, also referred to as bandwidth, of corresponding Larmor frequencies. As a result of the reduced bandwidth of Larmor frequencies, the bandwidth of the RF receiver portion of transceiver 52 can be reduced. The reduced bandwidth results in reception of less noise power by the transceiver 52, and a corresponding increase in the SNR, which improves image quality. Another result of the reduced bandwidth of the Larmor frequencies is that the bandwidth of the RF transmitter portion of transceiver 52 can also be reduced. The reduced RF transmitter bandwidth may allow reduced transmitter power. Reducing the transmitter power reduces energy consumption, the complexity and size of the transmitter and corresponding power supplies, and undesirable RF exposure to the patient. Alternately, rather than reducing the RF transmitter and receiver bandwidths, the relatively smaller value of the gradient $G_z$ permits imaging a thicker planar area for the same bandwidth.

The aforementioned results are obtained in a small magnet with a significant degree of peripheral access because there is no requirement that the magnetic field gradient be substantially zero in the imaging region.

OPERATION

To produce an image of an object with MRI apparatus 10, the object, such as hand 64, is placed through the access opening 42 and into the portion 62 of the magnetic field 58 where the surfaces 60a–e are substantially parallel and planar. RF electromagnetic waves at a Larmor frequency corresponding to the magnitude of the magnetic field in one of the surfaces 60a–e, for example surface 60a, are generated by transceiver 52 and transmitted by antenna 54 into the hand 64. Through methods widely known in the art, the nuclei are encoded with field gradients transverse to the surface for spatial encoding and identification of the nuclei. Nuclei in the portion of the hand 64 intersected by surface 60a are excited to different energy states by the electromagnetic waves transmitted at the Larmor frequency. These nuclei subsequently generate detectable electromagnetic waves, referred to as spin echoes, characteristic of the nuclei. The electromagnetic waves generated by the nuclei are received by antenna 54 and transceiver 52, and are then processed by methods widely known in the art to produce an image of the hand 64.

While the particular MRI apparatus for imaging an object as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An MRI apparatus for imaging an object in a nonhomogeneous magnetic field which comprises:
   a base;
   a first magnet having an arcuate North pole face mounted on said base;
   a second magnet having an arcuate South pole face mounted on said base to establish a channel region between said North pole face of said first magnet and said South pole face of said second magnet and to create a nonhomogeneous magnetic field in said channel region, a portion of said magnetic field having contiguous surfaces, each said surface having a substantially constant magnetic field magnitude, with said surfaces having mutually different magnetic field magnitudes; and
   a transceiver unit for selectively irradiating one said surface in said magnetic field to image an object over said surface when said object is positioned in said channel region.

2. An apparatus as recited in claim 1 wherein said North pole face of said first magnet and said South pole face of said second magnet respectively comprise:
   an upright area oriented substantially perpendicular to said base; and
   an inclined area, said inclined area being located between said upright area and said base and slanting from said upright area at an obtuse angle toward said base.

3. An apparatus as recited in claim 2 wherein said obtuse angle is approximately one hundred and thirty-five degrees (135°).

4. An apparatus as recited in claim 2 wherein said upright area of said first magnet is distanced from said upright area of said second magnet to establish an access therebetween into said region.

5. An apparatus as recited in claim 2 wherein said North pole face and said South pole face respectively further comprise an elevating area, said elevating area being substantially perpendicular to said base and located between said inclined area.

6. An apparatus as recited in claim 2 wherein said North pole face and said South pole face respectively further comprise a gap, said gap being perpendicular to said North pole face and said South pole face.

7. An apparatus as recited in claim 1 wherein said first magnet is formed with a gap and said second magnet is formed with a gap.

8. An apparatus as recited in claim 5 wherein said transceiver unit includes an antenna, said antenna being located between said respective elevating areas of said first magnet and said second magnet.

9. An apparatus as recited in claim 1 wherein said transceiver unit radiates electromagnetic waves at a range of Larmor frequencies determined by the range of said magnetic field magnitudes, between a pair of said surfaces.

10. An apparatus as recited in claim 1 wherein said magnetic field is further characterized by a constant magnetic field strength gradient in said portion of said magnetic field.

11. An apparatus as recited in claim 1 wherein said surfaces are substantially planar.

12. A magnet apparatus for generating a nonhomogeneous magnetic field to image an object which comprises:
    a base;
    a first magnet mounted on said base, said first magnet with a North pole face having an upright area oriented substantially perpendicular to said base, and an inclined area located between said upright area and said base, said inclined area slanting from said upright area at an obtuse angle toward said base; and
    a second magnet having a South pole face, said South pole face having an upright area oriented substantially perpendicular to said base, and having an inclined area located between said upright area and said base and slanting from said upright area at an obtuse angle toward said base, said second magnet being mounted on said base to establish a substantially U-shaped region between said North pole face of said first magnet and said South pole face of said second magnet to create a nonhomogeneous magnetic field in said region, a portion of said magnetic field having contiguous surfaces, each said surface having a substantially constant magnetic field magnitude, with said surfaces having mutually different constant magnetic field magnitudes.

13. A magnet apparatus as recited in claim 12 wherein said upright area of said first magnet is distanced from said upright area of said second magnet to establish an access therebetween into said region.

14. A magnet apparatus as recited in claim 12 wherein said obtuse angles are approximately one hundred thirty-five degrees (135°).

15. A magnet apparatus as recited in claim 12 wherein said upright area of said North pole face is substantially planar, and said upright area of said South pole face is substantially planar, said upright area of said North pole face being oriented substantially parallel to said upright area of said South pole face.

16. A magnet apparatus as recited in claim 12 wherein said North pole face and said South pole face respectively further comprise an elevating area, said elevating area being substantially perpendicular to said base and located between said inclined area and said base.

17. A magnet apparatus as recited in claim 12 wherein said surfaces are substantially planar.

18. A magnet apparatus as recited in claim 12 wherein the median value of the magnetic field magnitude of said surfaces of constant magnetic field magnitude is about two thousand Gauss (2,000 Gauss).

19. A magnet apparatus as recited in claim 12 wherein said magnetic field is further characterized by a substantially constant magnetic field strength gradient in said portion of said magnetic field.

20. A magnet apparatus as recited in claim 19 wherein said substantially constant magnetic field strength gradient has a value between about two Gauss per millimeter (2 Gauss/millimeter) and about four Gauss per millimeter (4 Gauss/millimeter).

21. A magnet apparatus as recited in claim 12 wherein said first magnet and said second magnet are permanent magnets.

22. A magnet apparatus as recited in claim 12 wherein said first magnet and said second magnet are electromagnets.

23. A magnet apparatus as recited in claim 12 wherein said first magnet and said second magnet are superconducting magnets.

24. A magnet apparatus as recited in claim 12 wherein said base is formed with an opening between said first magnet and said second magnet.

\* \* \* \* \*